United States Patent [19]

Hanazono et al.

[11] 3,968,019
[45] July 6, 1976

[54] METHOD OF MANUFACTURING LOW POWER LOSS SEMICONDUCTOR DEVICE

[75] Inventors: Masanobu Hanazono; Osamu Asai; Moriaki Fuyama; Masao Iimura; Hideyuki Yagi; Masahiro Okamura, all of Hitachi, Japan

[73] Assignee: Hitachi, Ltd., Japan

[22] Filed: Mar. 21, 1975

[21] Appl. No.: 560,880

[30] Foreign Application Priority Data
Mar. 25, 1974  Japan................................ 49-32574

[52] U.S. Cl................................ 204/192; 204/298; 357/15; 427/38; 427/84; 118/49.1
[51] Int. Cl.$^2$.................... C23C 15/00; H01L 29/48
[58] Field of Search.............. 204/192, 298; 357/15; 427/30, 38, 39, 84, 90, 88

[56] References Cited
UNITED STATES PATENTS

| | | | |
|---|---|---|---|
| 3,451,912 | 6/1969 | D'Hevrle............................ | 204/192 |
| 3,832,232 | 8/1974 | Sohlbrand............................ | 427/88 |
| 3,855,612 | 12/1974 | Rosvold........................ | 204/192 X |

OTHER PUBLICATIONS

D. M. Mattox, "Fundamentals of Ion Plating", J. Vac. Sci. Technol. vol. 10, no. 1, pp. 47–52, (1973).
R. T. Johnson, Jr. et al., "Resistive Properties of Indium & Indium-Galuum Contacts to CdS", Solid State Elect., vol. 11, pp. 1015–1020. (1968).
"Sputtering & Ion Plating", NASA Special Pub., SP-5111, (1972).

Primary Examiner—John H. Mack
Assistant Examiner—Aaron Weisstuch
Attorney, Agent, or Firm—Craig & Antonelli

[57] ABSTRACT

By forming a metallic coating on a sufficiently cleaned semiconductor substrate through ion plating, a low power loss and high switching speed semiconductor device is obtained which differs from an ordinary semiconductor device with a diffused junction. In an interface between the metallic coating and the semiconductor substrate, a considerably thin metal-injected layer is formed toward the semiconductor substrate. Schottky barrier devices may be formed by the method of the invention.

13 Claims, 19 Drawing Figures

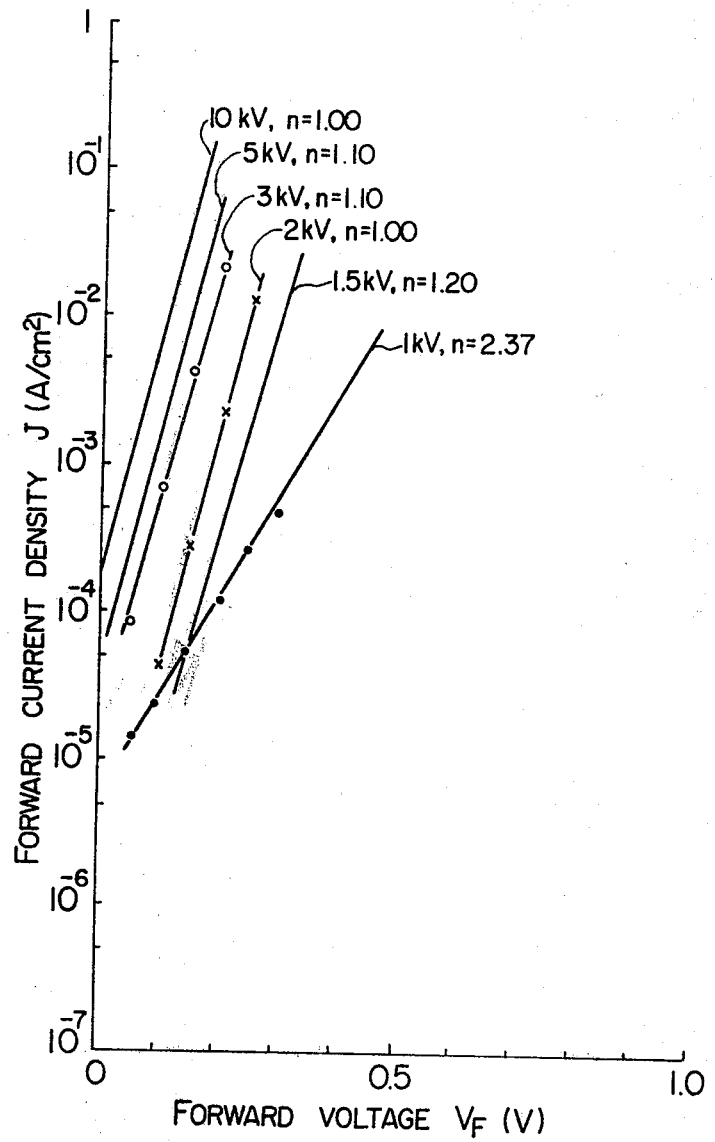

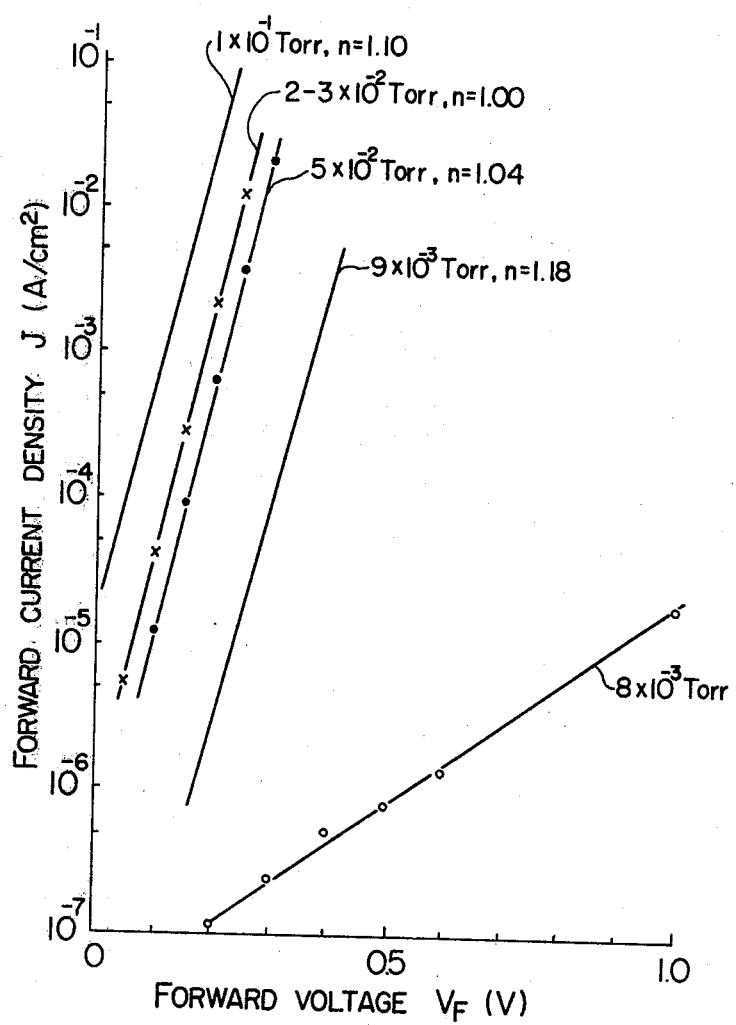

METHOD OF MANUFACTURING LOW POWER LOSS SEMICONDUCTOR DEVICE

BACKGROUND OF THE INVENTION

1. FIELD OF THE INVENTION

This invention relates to a method of manufacturing semiconductor devices wherein a semiconductor device of a low forward power loss at a high current density and of a high switching speed characteristic is readily produced.

2. DESCRIPTION OF THE PRIOR ART

Conventionally, as a low operating voltage and high switching speed semiconductor device, a semiconductor device has been known which comprises a semiconductor wafer deposited with a metallic thin film forming a so-called Schottky barrier. For the deposition of the metallic thin film, electroplating, evaporation and the like have been used. With these measures, however, it was impossible to completely remove contaminations such as oxides created on the surface of the semiconductor wafer. With another method, such as sputtering, on account of slow deposition speed the semiconductor wafer suffered from contamination, heat or bombardment by charged particles during the sputtering, thereby resulting in deterioration of characteristics of the semiconductor devices. The deposition of the metallic thin film is also accomplished through a chemical vapor deposition method. With the last method, however, high deposition temperature deteriorated the semiconductor wafer and halogen gases gave rise to damage to the oxide film, thus preventing the production of desirable semiconductor devices. To conclude, the conventional methods as mentioned above succeeded in obtaining a semiconductor wafer in contact with a metallic film in a micro-area, but failed to produce large current capacity semiconductor devices through industrially available methods.

A recent development has been the ion implantation method in which an ion beam bombards the semiconductor wafer with the intention of forming a diffusion layer of a given concentration on a local area of the semiconductor wafer. With the ion implantation method, however, since an ion beam of high energy level is bombarded into a semiconductor substrate, a highly concentrated diffusion layer is formed in the semiconductor substrate in a thickness of more than 1000 A with the resultant creation of a P-N junction at the boundary between the diffusion layer and the semiconductor substrate. This inevitably results in a large forward voltage drop. In addition, it is impossible for the ion implantation method to form an ohmic contact on the surface of the diffusion layer, and there arises a need for providing the ohmic contact through other methods, for example, plating or evaporation.

A further proposal has been directed to high switching speed semiconductor devices manufactured by diffusing gold. In this proposal, a P-N junction is formed in a silicon semiconductor wafer, gold is diffused, and thereafter an ohmic contact is provided for an electrode. A silicon semiconductor device obtained therethrough reduces by the aid of diffused gold the lifetime of minority carriers in the silicon semiconductor wafer so that the number of residual minority carriers is decreased under the application of reverse voltage, thereby to suppress the effect of the minority carriers as much as possible. Accordingly, a high switching speed is obtainable, but the number of minority carriers is decreased and in addition, the P-N junction having inherently a large diffusion potential by itself, causes a large forward voltage drop.

SUMMARY OF THE INVENTION

A first object of this invention is to provide a novel method of manufacturing a semiconductor device having a low forward power loss at high current density and high switching speed.

A second object of the invention is to provide a method of manufacturing, through ion plating, a semiconductor device with a metal-semiconductor contact junction which is improved in forward power loss at high current density or high voltage and in switching speed as compared to a semiconductor device with a P-N junction formed by a diffusion process.

A third object of the invention is to provide ion plating conditions for forming desirable metal-semiconductor junctions.

A fourth object of the invention is to provide an industrially available method of manufacturing, through ion plating, semiconductor devices for practical use.

BRIEF DESCRIPTION OF THE DRAWING

FIGS. 4 and 5 are graphs showing forward characteristics of semiconductor devices embodying the invention, FIG. 4 giving characteristics when cathode voltage is varied and FIG. 5 giving characteristics when pressure is varied.

DETAILED DESCRIPTION OF PREFERRED EMBODIMENTS

In this invention, a thin metallic film is formed on a semiconductor wafer through ion plating to provide a rectifier manifesting a small forward voltage drop at high current density, a large breakdown voltage and a sufficiently high switching speed. A semiconductor device according to the invention comprises a metal-injected layer of several tens to thousands of angstroms depth formed in the surface of a semiconductor substrate and an ohmic contact layer formed on the metal-injected layer, the ohmic contact layer being of the same metal as the injected layer. The injected layer herein is referred to as a region in which the specified metal is contained by more than $10^{15}$ atoms/cm$^3$. As far as the invention is concerned, an ion microanalyzer was used for analyzing the injected layer stripped of the metallic coating to determine the depth of the injected layer. Characteristics of a barrier identical with this injected layer determine rectifying characteristics of the semiconductor device, and a relation between the current density and voltage is expressed by the following equation.

$$J = J_S[\exp(qV/nkT) - 1] \quad (1)$$

$$J_S = AT^2 \exp[-q\phi_B/kT] \quad (2)$$

where, $J$: current density
$J_S$: saturated current density
$q$: electronic charge
$k$: Boltzmann's constant
$T$: absolute temperature
$A$: Richardson constant
$\phi_B$: height of barrier
$V$: voltage applied to barrier
$n$: coefficient obtained from gradient of forward voltage-forward current (in logarithmic scale) characteristics In equation (1), the closer the coefficient $n$, approaches one, the more ideal the barrier becomes, and a low loss rectifier will be obtained.

In accordance with the ion plating method, evaporated particles are ionized in a glow discharge and the ionized particles are brought, by electrostatic attractive force, into contact with a member to be coated, which member is supported on the cathode electrode. The ion plating method is advantageous in that adhesive strength is higher as compared to the conventional sputtering, and throwing power (or deposition efficiency) is increased on account of the deposition by electrostatic attractive force.

Figure 1:
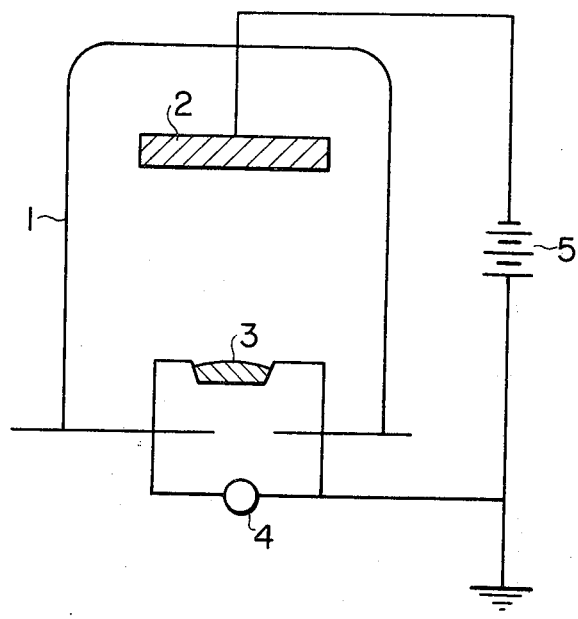
FIG. 1 is a schematic representation of an ion plating apparatus.

Referring now to FIG. 1, there is illustrated one example of primitive equipment for practising the ion plating method. The equipment as shown in FIG. 1 comprises a vacuum chamber 1 communicated with an evacuation system (not shown), a cathode electrode 2 supporting a member to be deposited, a power source 4 for heating an evaporation boat 3 connected thereto, and another power source 5 provide for the cathode electrode 2. The atmosphere inside vacuum chamber 1 is regulated to provide a given condition. A semiconductor substrate is supported by cathode electrode 2. Between the anode electrode identified with the heated evaporation boat 3 carrying an evaporation substance source and the cathode electrode, a glow discharge space is established so that metallic particles vaporized from the evaporation boat pass through the glow discharge space under the influence of ionization to be attracted to the cathode electrode.

The glow discharge will be generated by applying a voltage across the anode and cathode electrodes within the vacuum chamber, or may be, generated within a space defined by a pair of glow discharge electrodes interposed between the anode and cathode electrodes. Conditions for ion plating include a cathode bias voltage of 0.5 to 10 KV and a low pressure inert gas atmosphere of $10^{-1}$ to $10^{-4}$ Torr. In cases where the atmosphere is of very low pressure, for the purpose of increasing ionization rate of the evaporation metal particles, the D.C. power source is superimposed with radio frequencies or is used along with an electron shower. Under these conditions, a metal-injected layer of several tens to thousands of angstroms is formed beneath the semiconductor substrate surface. The injected layer is followed, if desired, by an ohmic contact layer formed thereon and containing the same metal as the injected layer.

Undoped silicon single crystals, silicon single crystals of either P conductivity or N conductivity type dependent on acceptor or donor imputities, gallium-arsenic or gallium-phosphorus compound semiconductors, or germanium crystals may constitute the substrate utilized for a semiconductor device according to the invention. Impurities responsible for determination of conductivity type are selected in the well-known manner to meet the semiconductor substrate used. Impurities are doped to establish resistivity in the order of 10 to 0.1 $\Omega$.cm at the surface to be contacted with metal and the impurity concentration is determined accordingly.

Generally speaking, in order to form a metal-semiconductor junction, it is necessary for the semiconductor substrate to be cleaned at least at its surface to the extent that substances other than compositions of the semiconductor are substantially removed. To obtain such a cleaned surface, in the prior art, the semiconductor substrate is cleaned chemically in an ordinary manner and then placed in a sputtering apparatus at which it is subjected to a back sputtering at about 1 to 2 KV voltages.

According to a novel method, the semiconductor substrate will be cleaned through sputtering by way of an ion plating equipment, wherein the equipment is set such that pressure inside the vacuum chamber is $10^{-2}$ to $10^{-3}$ Torr with inert gases such as argon and xenon having relatively large specific gravity while the evaporation source is not heated, and a glow discharge is generated concurrent with the application of cathode voltage. Under the influences of glow discharge the inert gases are charged and attracted toward the cathode to bombard the semiconductor substrate carried thereon. As a consequence, residuals deposited on the surface of semiconductor substrate, including oxide films, contaminants resulting from etching and photoresists will be etched away by sputtering. The semiconductor substrate treated in this manner can have a highly cleaned surface superior to that obtained by any other conventional treatments. This assures uniform and steady contact of metal. As compared to the prior art method wherein after being subjected to the back sputtering, the semiconductor substrate is then taken out of the vacuum chamber and exposed to metal evaporation, a wider effective area of metal-semiconductor junction can be obtained according to the ion plating method. Consequently, a semiconductor device having a metal-semiconductor junction of larger effective area can be realized.

Ion plating operation is initiated by placing a semiconductor substrate and evaporation substance in the vacuum chamber. The vacuum chamber is evacuated to $10^{-5}$ to $10^{-8}$ Torr and thereafter inert gases are introduced into the vacuum chamber with an ultimate pressure of $10^{-1}$ to $10^{-4}$ Torr. Under this condition, when the evaporation source is heated and the cathode electrode voltage is applied, ion plating is performed. Composition of the metallic coating to be deposited on the semiconductor substrate may include any variety of metals. Especially, it was confirmed through experiments that nickel, copper, gold, silver, tin, lead, aluminum, indium, platinum, gallium, tungsten and molybdenum as well as alloys thereof showed an excellent result. Ambient gas includes inert gases such as helium, neon, argon, krypton, xenon and mixtures thereof. When used with a D.C. power source, the apparatus employs inert gases of $10^{-1}$ to $10^{-3}$ Torr pressure. If the inert gases are enriched, the thus created film will have a large electrical resistance and considerable amounts of the inert gases tend to remain in the film. With reduction of the pressure to the order of $10^{-4}$ Torr, the nature of created metallic film will be improved. On the other hand, the mean free path of vaporized metal particles becomes long with the result that the ionization probability is reduced. Accordingly, an expedient is required for improving the ionization probability, for example, by making use of high frequencies.

The voltage to be applied to the cathode electrode has a relation to ionization probability mentioned above, but its value is usually determined dependent on the configuration of the semiconductor substrate carried on the cathode and other conditions. If the cathode voltage is too low, the metal-injected layer is not formed in the semiconductor substrate with sufficient depth and uniformity. Conversely, with excessively high cathode voltage, the semiconductor substrate will be partially molten or spark discharges may cause damage to the substrate. Further, in the latter case, even if such damage is not caused, an excessively deepened injected layer will form a P-N junction across which a large voltage drop will occur. Therefore, a proper cathode voltage should be selected case by case.

The semiconductor substrate has partially, on its surface, insulation layers such as oxide films and isolated regions such as guard rings. When metal is ion plated on these layers or regions, charge is accumulated therein and the accumulated charge beyond a threshold causes an abnormal discharge which sometimes damages the semiconductor substrate. To prevent such abnormal discharge, it is advisable to coat the substrate with a conductive film which permits the charge to discharge through the substrate and cathode electrode, and to remove the unwanted conductive film after ion plating has been finished. The conductive film is so thin that the charged metal particles bombarding on the film are allowed to form the metal injected layer in the semiconductor substrate next to the conductive film, but in contrast, the thickness of the film is large enough to prevent an excessive charge from being accumulated. Accordingly, it is recommended that the thickness of the additional conductive film should be in the order of 50 to 500 A.

A photoresist can be made of use for forming, through ion plating, a precisely configured metal coating in the surface of semiconductor substrate. More particularly, since the metal particles can pass through residues resulting from photoresist development to reach the semiconductor substrate, the metal coating is formed having a precise configuration in accordance with the photoresist mask. If the metal coating is formed through conventional evaporation methods, since residues of photoresist development are obstructive of the adhesion of metal coating, the surface of the semiconductor substrate is etched to remove the residue. But the photoresist mask is damaged by this etching, thus preventing a precise pattern from being formed.

To further improve characteristics of the semiconductor device produced by ion plating, the metal-coated semiconductor is subjected to heat treatment within the vacuum chamber after ion plating. The device placed in the ion plating equipment is heated to a given temperature in an inert gas atmosphere by a glow discharge thereof when a voltage is applied between the anode and cathode electrodes. The heat treatment temperature ranges more than 350°C for silicon semiconductor, but less than the alloy forming temperature of silicon and metal to be plated.

EXAMPLE 1

Figure 2:
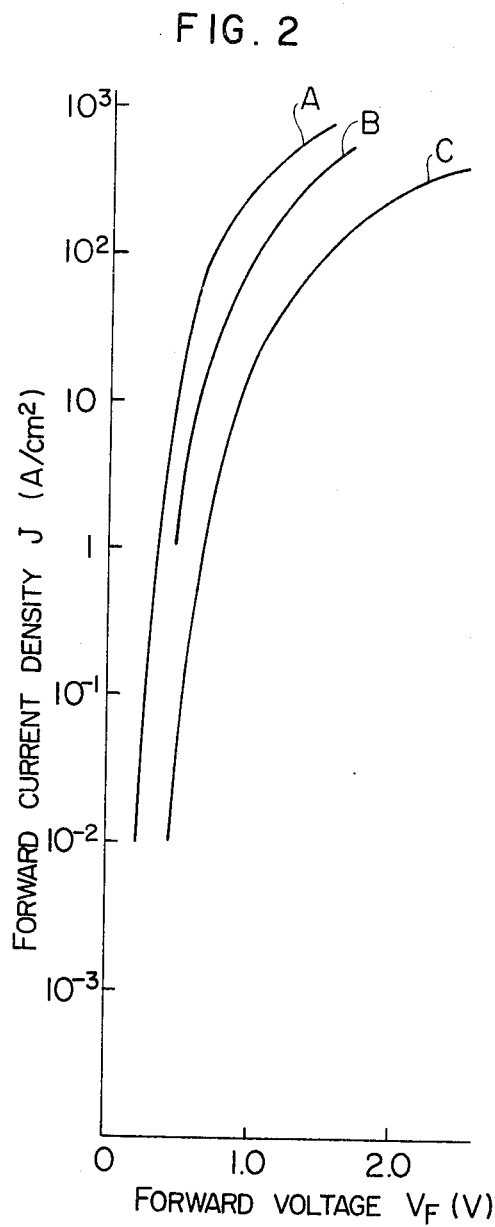
FIG. 2 is a graph useful to compare characteristics of a semiconductor device according to the invention with those of semiconductor devices produced by other manufacturing methods.

After being washed in water, cleaned in alkali, cleaned in acid and ultrasonically cleaned in water in a usual cleaning manner, an $N^+$-type silicon single crystal substrate of 200 $\mu$m thickness was placed in an epitaxial growth apparatus. The substrate was subjected to hydrogen etching and an N-type silicon single crystal of 0.5 $\Omega$.cm resistivity was grown on the substrate to an 8 $\mu$ thickness. The substrate was mounted on cathode 2 of the ion plating equipment shown in FIG. 1 with the N-type surface of epitaxially growthed silicon single crystal facing evaporation boat 3 which was filled with aluminum. The vacuum chamber 1 was evacuated to $10^{-8}$ Torr and argon gases were introduced into the vacuum chamber with an ultimate pressure of $10^{-2}$ Torr. When the pressure became stable, the evaporation boat was heated by heating power source 4 to the extent that no evaporated atoms were emitted, and a 4 KV voltage was applied across the cathode 2 and evaporation boat 3 so that a glow discharge was generated between the evaporation boat and cathode electrode. In this phase, a sputter cleaning was conducted for ten minutes. Then, while maintaining the glow discharge at $10^{-2}$ Torr pressure, aluminum was deposited on the silicon substrate to a 5 $\mu$ thickness by increasing the current from heating power source 4. The semiconductor substrate deposited with the thin metallic thin film was etched at its metallic surface into a given configuration. A gold lead was soldered to the $N^+$ surface and relationships between the forward voltage drop and current density were measured. For comparison, characteristics of semiconductor devices of the same configuration prepared through ion implantation and heat diffusion were measured. In FIG. 2, curve A represents characteristics of the device according to the invention, curve B that of the device prepared through ion implanation, and curve C that of the device prepared through heat treatment. It will be seen from the figure that the semiconductor device of the invention has a small forward voltage near 100 A/cm² current density and it operates at lower voltage than other devices.

EXAMPLE 2

As in Example 1, an N-type epitaxial layer of 0.5 $\Omega$.cm resistivity was formed on an $N^+$-type silicon single crystal substrate. On the N-type epitaxial layer a 2 $\mu$ thick dioxide silicon coating was formed through chemical vapor deposition. A hole of 0.1 mm diameter was formed in the silicon dioxide silicon coating by etching. The completed device was cleaned sufficiently in the same manner as Example 1. Then, aluminum was ion plated to a 3 $\mu$ thickness on the surface of the device under 2 KV cathode voltage and $1 \times 10^{-2}$ Torr argon pressure. The thus plated aluminum was etched into a given configuration and a gold lead was soldered to the rear surface of the silicon single crystal substrate to complete a semiconductor device having a metal-semiconductor junction. The height of the barrier of the semiconductor device thus prepared was 0.69 to 0.75 eV.

EXAMPLE 3

After a gallium arsenide single crystal, with a thickness of 200 $\mu$, was cut into a 5 mm × 5 mm block, it was chemically and ultrasonically cleaned in water as in Example 1. Zinc was diffused into the substrate with a surface impurity concentration of $1 \times 10^{19}$ atoms/cm$^3$ and 5 $\mu$ depth to form a P$^+$ layer. The substrate was sputter cleaned in an ion plating apparatus and was coated with indium to a 3 $\mu$ thickness by ion plating under 2 KV cathode voltage and $1 \times 10^{-2}$ Torr argon pressure. The height of the barrier of the semiconductor device thus produced was 0.85 to 0.93 eV.

EXAMPLE 4

Figure 3A:
FIGS. 3a to 3f are diagramtic representations, in section, useful to explain manufacturing processes of a semiconductor device according to the invention.
Figure 3B:
Figure 3C:
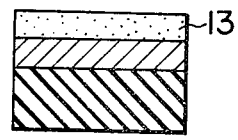
Figure 3D:
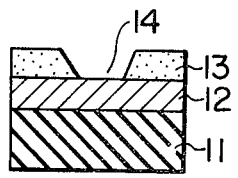
Figure 3E:
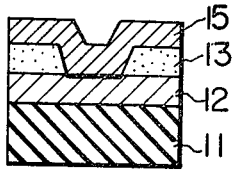
Figure 3F:
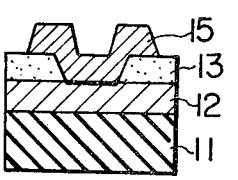

To determine conditions for ion plating, a semiconductor device having a predetermined area of metallic layer was used. With reference to FIG. 3, a production process of the semiconductor device will be described. An N$^+$-type silicon wafer substrate 11 as shown in FIG. 3a has a resistivity of 0.01 $\Omega$.cm. An N-type epitaxial layer 12 of 2 $\Omega$.cm resistivity is grown to a 10 to 15 $\mu$ thickness on the substrate 11, as shown in FIG. 3b. Then, as shown in FIG. 3c, an oxide coating 13 is formed at about 10 $\mu$ thickness by heating the entire surface of the N-type epitaxial layer at 1050°C in steam. Instead of thermal oxidation, the oxide coating may be formed by chemical vapor deposition, evaporation or sputtering methods. As shown in FIG. 3d, the oxidized coating 13 is partially removed by a conventional etching technique to form a hole of 1.0 mm diameter. The hole 14 is a contact window, and it forms the location for the metal silicon contact. As shown in FIG. 3e, barrier metal 15 of aluminum is ion plated by controlling ambient gas pressure and the cathode voltage. Through ion plating, aluminum was deposited on silicon and it formed the aluminum electrode. In the last phase, as shown in FIG. 3f, the electrode is partially removed by photoetching techniques to complete a low power loss diode.

Reference is made to FIG. 4 wherein characteristics of the devices produced by maintaining the pressure at 2 to 3 × 10$^{-2}$ Torr for aluminum ion plating and by varying the voltage between the cathode and anode electrodes from 1 KV to 1.5 KV, 2 KV, 3 KV, 5 KV and 10 KV. The forward characteristics, i.e., so-called V-I characteristics were measured with a positive aluminum electrode and a negative substrate electrode.

From FIG. 4, the coefficient n explained in relation to equations (1) and (2) in the foregoing was measured and it was proved that the ion plating voltage applied between the cathode and anode electrodes was more than 1.5 KV for satisfying $n \approx 1$. FIG. 5 shows V-I characteristics of the devices when the ion plating voltage was maintained at 2 KV and the pressure was varied from $8 \times 10^{-3}$ Torr to $9 \times 10^{-3}$ Torr, 2–3 × 10$^{-2}$ Torr, 5 × 10$^{-2}$ Torr and 1 × 10$^{-1}$ Torr. From FIG. 5, n was measured and it was proved that the pressure was more than $9 \times 10^{-3}$ Torr for satisfying $n \approx 1$.

EXAMPLE 5

Figure 6:
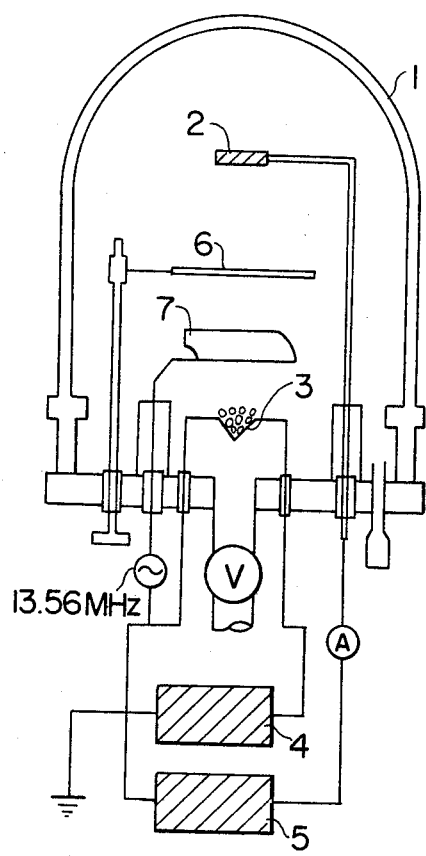
FIG. 6 is a schematic diagram of an ion plating apparatus embodying the invention.
Figure 7:
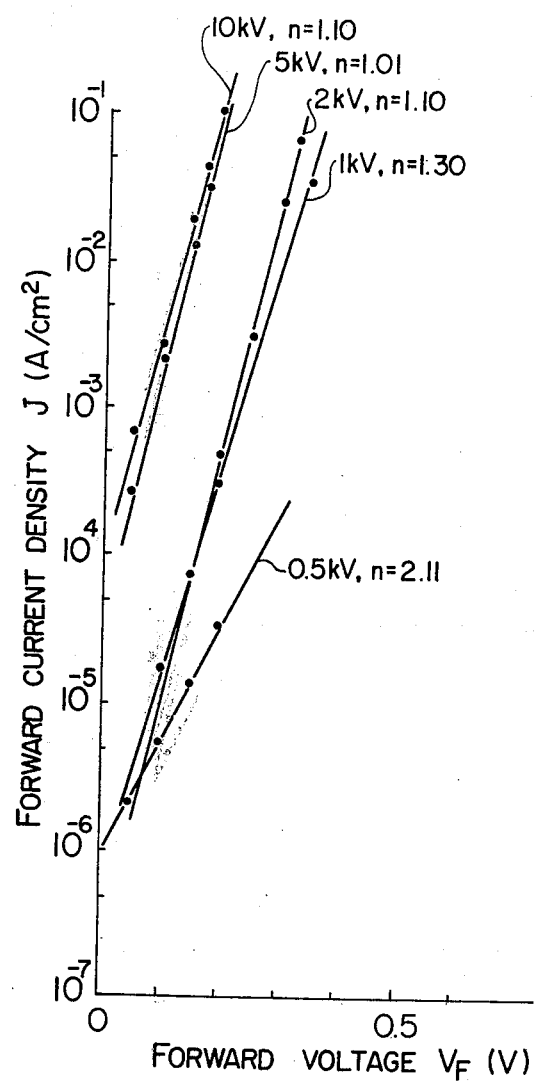
FIGS. 7 and 8 are graphs showing forward characteristics of semiconductor devices produced with the equipment of FIG. 6.

As explained with reference to Example 4, the ambient pressure suitable for ion plating is more than 9 × 10$^{-3}$ Torr when an ordinary ion plating appartus is used. To improve the nature of the metallic coating such that the breakdown voltage is increased, the pressure needs to be lowered. FIG. 6 shows a radio frequency ion plating equipment. In the figure, numeral 1 designates a vacuum chamber, 2 a substrate (cathode), 6 a shutter, 7 a radio frequency electrode (RF electrode), 3 an evaporation source (anode), 5 a radio voltage source and 4 a power source for heating evaportion source 3. The radio frequency ion plating equipment is evacuated to 10$^{-6}$ to 10$^{-7}$ Torr. For cleaning the surface of the substrate by sputtering, argon gases are introduced with an ultimate pressure of 10$^{-2}$ to 10$^{-3}$ Torr and the substrate surface is sputter cleaned under the application of cathode voltage of 1 to 2 KV. Then, the pressure in the vacuum chamber is controlled to 5 × 10$^{-4}$ Torr and aluminum is ion plated by applying a 2 KV and 13.56 MHz radio frequency voltage to the RF electrode while varying the cathode voltage from 0.5 KV to 1 KV, 2 KV, 5 KV and 10 KV. In this manner, a diode of the same configuration as Example 4, was obtained. FIG. 7 shows V-I characteristics of the diode thus produced in parameter of cathode voltage.

Figure 8:
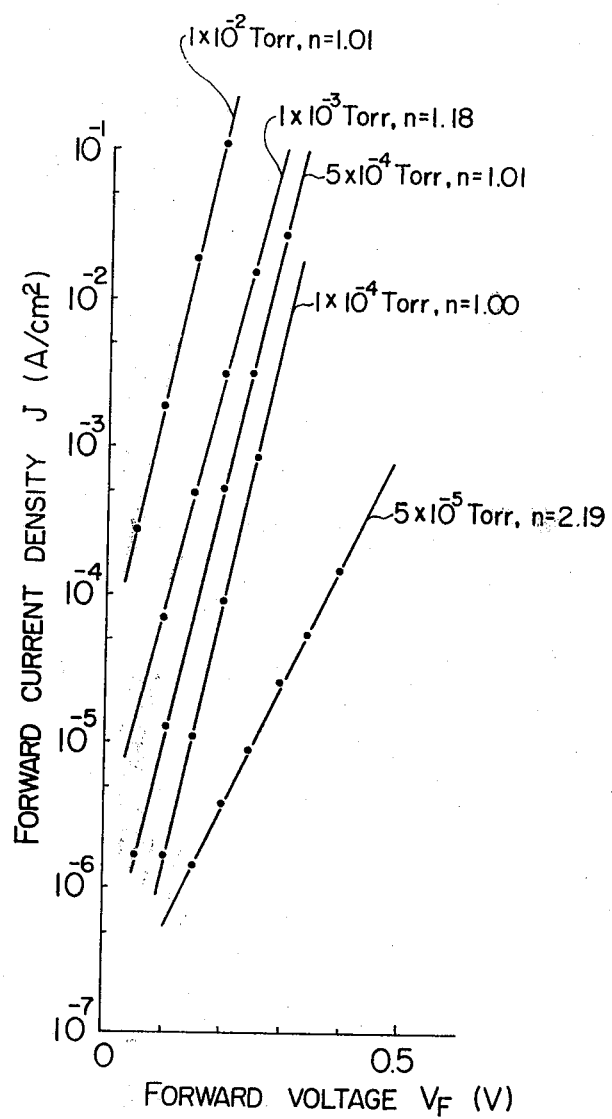

FIG. 8 shows V-I characteristics of the diode obtained when radio frequency voltage is 2 KV, the cathode voltage is 2 KV, and argon gas pressure is varied from 5 × 10$^{-5}$ Torr to 1 × 10$^{-4}$ Torr, 5 × 10$^{-4}$ Torr, 5 × 10$^{-3}$ Torr and 1 × 10$^{-2}$ Torr.

The radio frequency voltage was about 1 to 5 KV necessary for generating a glow discharge, and even with 2 KV and 4 KV radio frequency voltages the value of n was not influenced.

EXAMPLE 6

Figure 9:
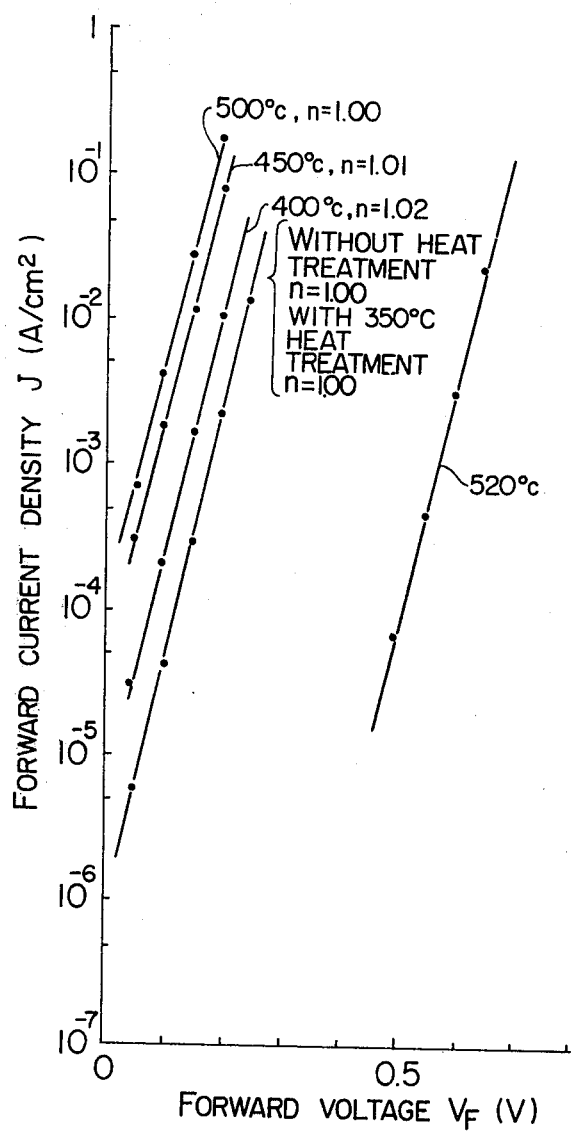
FIG. 9 is a graph showing variations in forward characteristics of semiconductor devices when subjected to heat treatment.

An aluminum film was deposited by the ion plating method onto a semiconductor device, having the same configuration as Example 4 and then subjected to a heat treatment. The aluminum ion plating was conducted with 2 KV cathode voltage and 2 × 10$^{-2}$ Torr ambient argon pressure. FIG. 9 shows relationships between forward voltage, forward current (with the heat treatment temperature after the deposition of aluminum as a parameter) and the value of n. As seen from the figure, in the case of aluminum deposition, characteristics of the device do not vary with the heat treatment temperature below 350°C. As the heat treatment temperature rises from 400°C to 450°C and 500°C, the values of n were not affected but forward voltage drops became smaller, thereby improving characteristics of the device considerably. Above 520°C, the forward voltage drop became large. This is presumably caused by conversion of the metal-semiconductor junction into the P-N junction. The depth of the injection layer formed in the interface between the metal and the semiconductor substrate was 500 to 900 A for the device heat-treated below 500°C; the depth was large ranging from 1200 A to 1500 A and irregular for the device heat-treated at 520°C. In conclusion, it is necessary to form an injection layer of less than about 1000 A in order to obtain an excellent metal-semiconductor contact junction.

EXAMPLE 7

In this example, other types of semiconductor devices are produced. A desired metallic coating is formed precisely on the surface of a substrate by making use of a photoresist mask and a lower metallic layer is formed on the opposite surface of the substrate, from which lower metallic layer an ohmic contact is formed.

Figure 10A:
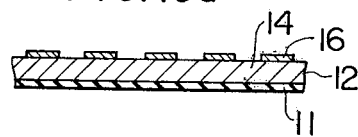
FIGS. 10a to 10d and FIG. 11 are diagramatic representations, in section, useful to explain the manufacturing method embodying the invention.
Figure 10B:
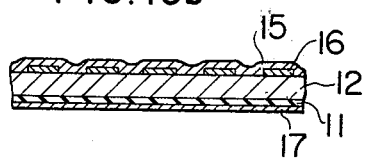
Figure 10C:
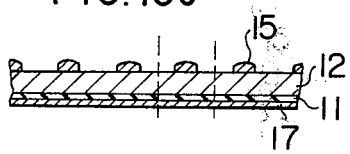
Figure 10D:
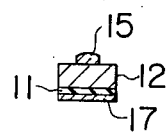

A cathode holder for holding the semiconductor substrate on the cathode is of a ring shape. The semiconductor substrate is fastened to the cathode in such a manner that a metallic coating having rectifying junction is faced upward, i.e. the lower metallic layer confronts the metal evaporation source at the anode. With reference to FIG. 10, an N-type silicon substrate 12 as shown in FIG. 10a is formed with an N+ layer 11 on one surface. Numeral 16 represents a photoresist film deposited on the other surface of the substrate, the photoresist film being partially removed to expose the substrate at portions 14. At portions 14 where the silicon substrate is exposed, a minimal amount of residue (not shown) remains which has not been removed during the photoresist development treatment. On this surface of the substrate is deposited metal 15 using ion plating. In this example, aluminum is used. Since, in ion plating, incident vaporized metal particles have an extremely large energy, they readily pass through the residue to assure direct contact with the silicon substrate. On the rear surface of the substrate is deposited lower metal layer 17. Then, the substrate is immersed in photoresist removing liquid so that the photoresist film is removed, leaving metal 15 deposited on portions 14 as shown in FIG. 10a and removing other portions of the metal from the silicon substrate. This is illustrated in FIG. 10c. The substrate is cut along dotted lines shown in FIG. 10c to complete a diode pellet of the invention as shown in FIG. 10d.

In this example, even when a residue, hard to remove, resulting from the photoresist development remains on the semiconductor substrate surface, a direct contact of metal with the substrate is assured. Therefore, a photoresist film can be used as a mask. In addition, it dispenses with an etching pretreatment of the semiconductor substrate so that a highly precise pattern of metallic coating can be obtained in accordance with a pattern of photoresist.

The metallic coating formed on the upper or contact forming surface of substrate opposite to the evaporation metal source contains much more ionized particles. The junction between the semiconductor substrate and metal is better than that formed on the lower surface facing the evaporation source. Since the lower surface of the substrate faces the metal evaporation source, the amounts of non-ionized metal particles will be larger than the contact forming side. The metallic coating on the lower surface is provided for forming an ohmic contact and therefore, no problem is caused as a result of the back side having more non-ionized particles compared with that of the contact forming side.

EXAMPLE 8

In cases where a guard ring or oxide coating layer is formed on a portion of the surface of semiconductor wafer, when charge accumulated in the oxide coating layer by ion plating exceeds a threshold, an abnormal discharge is caused at an interface between the oxide coating and guard ring or at a weak portion of the oxide coating, thereby sometimes destroying the device. This example eliminates these problems.

Figure 11:
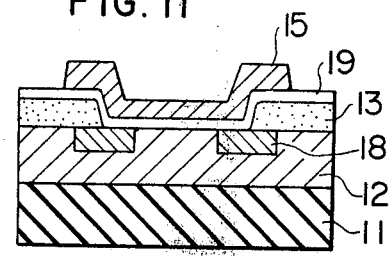

Referring to FIG. 11, an N+-type silicon wafer 11 is formed with an N-type layer 12. A guard ring 18 of P-type diffusion layer is formed in a portion of the N-type layer. On the guard ring is formed an oxide coating layer 13 by conventional technique. On the substrate thus prepared is formed by evaporation a layer 19 of metal to be ion plated. Preferably, evaporation is conducted with an ion plating apparatus rather than an apparatus exclusively used for evaporation, by heating the evaporation source and not applying a voltage to the semiconductor substrate. Completion of the evaporation is followed by a given ion plating. Since the evaporation and ion plating are conducted in the same chamber in this manner, no oxide film is formed and an excellent contact junction is obtained between the semiconductor and metal.

Evaporated layer 19 is required to have a thickness which permits the charge accumulated in the oxide film 13 by ion plating to be discharged to wider portions of the semiconductor wafer. With this example, it was proved that a thickness of more than 20 A essentially satisfied the requirement. For steady discharge, the thickness is preferably more than 50 A. Where evaporated layer 19 extends to the region to be ion plated, as in this example, a given injected layer should be formed in the semiconductor substrate through evaporated layer 19 on account of knock on effect of ion plating. In the case of an evaporated layer 19 of more than 7000 A thickness, it prevents the formation of required injected layer and accordingly, the thickness of the evaporated layer is preferably 50 to 5000 A. By providing such metal-evaporated layer for discharging the accumulated charge, abnormal discharge was prevented completely.

We claim:

1. A method of manufacturing a low power loss semiconductor device comprising supporting a semiconductor substrate on a cathode in an inert gas atmosphere of low pressure, the semiconductor substrate including a lower resistivity layer and a higher resistivity layer adjacent thereto, the higher resistivity layer being doped with sufficient impurities to provide a resistivity of about 0.1 to 10 Ω. cm, and bombarding the surface of the higher resistivity layer of the semiconductor substrate with metal particles ionized in a glow discharge region to deposit a metal coating on the semiconductor substrate thereby forming a semiconductor-metal contact junction.

2. A method of manufacturing a low power loss semiconductor device comprising supporting a semiconductor substrate on a cathode in an inert gas atmosphere of $10^{-1}$ to $10^{-4}$ Torr, the semiconductor substrate including a lower resistivity layer and a higher resistivity layer adjacent thereto, the higher resistivity layer being doped with sufficient impurities to provide a resistivity of about 0.1 to 10 Ω. cm and bombarding the surface of the higher resistivity layer of the semiconductor substrate with metal particles ionized in a glow discharge region to deposit a metal coating on the semiconductor substrate to form a metal-injected layer of 10 to 1000 A thickness in the semiconductor substrate beneath the metal coating.

3. A method according to claim 2, wherein a voltage of 1 to 10 KV is applied to the cathode.

4. A method of manufacturing a low power loss semiconductor device comprising supporting a semiconductor substrate on a cathode in an inert gas atmosphere of low pressure, the semiconductor substrate including a lower resistivity layer and a higher resistivity layer adjacent thereto, the higher resistivity layer being doped with sufficient impurities to provide a resistivity on the order of 0.1 to 10 Ω. cm, and bombarding the surface of the higher resistivity layer of the semiconductor substrate with metal particles ionized in a glow discharge region to deposit a metal coating on the semiconductor substrate to form a metal-injected layer of 10 to 1000 A thickness in the semiconductor substrate beneath the metal coating.

5. A method according to claim 4, wherein a photoresist mask pattern is formed on a surface of the semiconductor substrate to be coated with the metal coating.

6. A method of manufacturing a low power loss semiconductor comprising supporting a semiconductor substrate on a cathode in an inert gas atmosphere of $9 \times 10^{-3}$ to $10^{-4}$ Torr, and bombarding the semiconductor substrate with ionized metal particles to deposit a metal coating on the semiconductor substrate, formation of said ionized metal particles being facilitated by subjecting a metal source for said particles to an RF field to improve the ionization probability of the metal in said source.

7. A method of manufacturing a low power loss semiconductor device, comprising supporting a semiconductor substrate on a cathode in an inert gas atmosphere of low pressure, generating a glow discharge in the vicinity of the cathode to bombard the semiconductor substrate with ionized inert gases, bombarding the semiconductor substrate with ionized metal particles to deposit a metal coating on the semiconductor substrate, and heat-treating the metal coating-deposited semiconductor substrate at a predetermined temperature while maintaining the glow discharge in the vicinity of the cathode.

8. A method of manufacturing a low power loss semiconductor device, comprising supporting a silicon semiconductor substrate on a cathode in an inert gas atmosphere of low pressure, generating a glow discharge in the vicinity of the cathode to bombard the silicon semiconductor substrate with ionized inert gases, bombarding the silicon semiconductor substrate with ionized aluminum particles to deposit an aluminum coating on the silicon semiconductor substrate, and heating the aluminum coated silicon semiconductor substrate to a temperature of 400° to 500°C while maintaining the glow discharge in the vicinity of the cathode.

9. A method of manufacturing a low power loss semiconductor device, comprising supporting a semiconductor substrate on a cathode in an inert gas atmosphere of low pressure, bombarding the semiconductor substrate with ionized inert gases, bombarding the semiconductor substrate with neutral metal particles to deposit a metal coating of 50 to 500 A thickness on the semiconductor substrate, and bombarding the metal-coated semiconductor substrate with ionized metal particles.

10. A method according to claim 9, wherein the semiconductor substrate includes an electrically insulating layer at a region which the ionized metal particles are bombarded.

11. A method of manufacturing a low power loss semiconductor device, comprising the steps of supporting a semiconductor substrate on a cathode in an inert gas atmosphere of low pressure, bombarding the semiconductor substrate with ionized inert gases, bombarding the semiconductor substrate with neutral metal particles to deposit a metal coating of 50 to 500 A thickness on the semiconductor substrate, bombarding the metal coated semiconductor substrate with metal particles ionized with the application of a voltage of 1 to 10 KV to the cathode, and heating the semiconductor substrate to a temperature of 400° to 500°C while maintaining the glow discharge in the vicinity of the cathode.

12. A method according to claim 11 wherein said semiconductor substrate is a silicon semiconductor substrate and said metal is aluminum.

13. A method of manufacturing a low power loss semiconductor device having a metal-semiconductor contact junction, comprising supporting a semiconductor substrate in a cathode holder provided in an inert gas atmosphere of low pressure, and generating a glow discharge in the vicinity of the cathode holder to ion plate a metal coating on the semiconductor substrate by means of a metal source for evaporating metal particles to be ion plated on the semiconductor substrate, the semiconductor substrate being supported in the cathode holder such that the surface of the semiconductor substrate opposite the surface of the semiconductor substrate on which said metal-semiconductor contact junction is to be formed faces said metal source.

* * * * *